United States Patent [19]
Ozawa et al.

[11] Patent Number: 6,020,718
[45] Date of Patent: *Feb. 1, 2000

[54] BATTERY CAPACITY PREDICTING METHOD, BATTERY UNIT AND APPARATUS USING BATTERY UNIT

[75] Inventors: Hidekiyo Ozawa; Nobuo Tanaka; Masami Itoyama; Yoshiro Takeda, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/763,793

[22] Filed: Dec. 11, 1996

[30] Foreign Application Priority Data

Jul. 1, 1996 [JP] Japan .................... 8-171456

[51] Int. Cl.$^7$ ........................................... H02J 7/00
[52] U.S. Cl. .................. 320/116; 320/118; 320/134; 320/112; 324/434
[58] Field of Search .................. 320/6, 15, 16, 320/17, 18, 32, 39, 48, 134, 135, 136, 116, 118, 120, 121, 112, 113, 122; 324/434

[56] References Cited

U.S. PATENT DOCUMENTS

| | | | |
|---|---|---|---|
| 4,484,140 | 11/1984 | Dieu . | |
| 5,302,902 | 4/1994 | Groehl | 324/434 |
| 5,304,915 | 4/1994 | Sanpei et al. | 320/116 |
| 5,349,668 | 9/1994 | Gladstein et al. . | |
| 5,387,857 | 2/1995 | Honda et al. | 320/120 |
| 5,438,250 | 8/1995 | Retzlaff . | |
| 5,493,197 | 2/1996 | Eguchi et al. | 320/116 |
| 5,530,336 | 6/1996 | Eguchi et al. | 320/118 |
| 5,602,481 | 2/1997 | Fukuyama | 324/434 |
| 5,610,495 | 3/1997 | Yee et al. | 320/6 |
| 5,625,272 | 4/1997 | Takahashi . | |
| 5,644,212 | 7/1997 | Takahashi | 320/134 |
| 5,652,501 | 7/1997 | McClure et al. | 320/17 |
| 5,656,915 | 8/1997 | Eaves | 320/118 |
| 5,677,077 | 10/1997 | Faulk . | |
| 5,703,463 | 12/1997 | Smith | 320/134 |
| 5,818,201 | 10/1998 | Stockstad et al. | 320/116 |
| 5,825,155 | 10/1998 | Ito et al. | 324/434 |

FOREIGN PATENT DOCUMENTS

| | | |
|---|---|---|
| 0 566 386 | 10/1993 | European Pat. Off. . |
| 41 32 229 | 9/1991 | Germany . |
| 0 576 805 | 5/1993 | Germany . |
| 0 589 287 | 9/1993 | Germany . |
| 42 21 894 | 10/1993 | Germany . |
| 42 31 732 | 3/1994 | Germany . |
| 44 22 005 | 3/1994 | Germany . |
| 44 22 005 | 12/1995 | Germany . |
| 195 41 595 | 5/1996 | Germany . |
| 61-133583 | 6/1986 | Japan . |
| 7-255134 | 10/1995 | Japan . |
| 8-050902 | 2/1996 | Japan . |
| 95/30905 | 11/1995 | WIPO . |

*Primary Examiner*—Peter S. Wong
*Assistant Examiner*—K. Shin
*Attorney, Agent, or Firm*—Staas & Halsey LLP

[57] ABSTRACT

A battery capacity predicting method predicts a remaining capacity of a battery unit including a plurality of battery cells connected in series in an apparatus which uses the battery unit. The battery capacity predicting method includes the steps of comparing output voltages of each of the battery cells, and predicting the remaining capacity of the battery unit based on at least one of a minimum voltage and a maximum voltage out of the compared output voltages of the battery cells.

75 Claims, 10 Drawing Sheets

BATTERY CAPACITY PREDICTING METHOD, BATTERY UNIT AND APPARATUS USING BATTERY UNIT

BACKGROUND OF THE INVENTION

The present invention generally relates to battery capacity predicting methods, battery units and apparatuses using a battery unit, and more particularly to a battery capacity predicting method which is suited for predicting a remaining capacity of a battery which is easily damaged by an excessive discharge, a battery unit which enables the use of such a battery capacity predicting method, and an apparatus such as a portable electronic equipment using such a battery unit.

Recently, in apparatuses such as portable electronic equipments which are typified by notebook type personal computers or lap-top computers, lithium ion (Li$^+$) batteries or the like are more popularly used in place of nickel cadmium (NiCd) batteries, nickel metal hydrogen (NiMH) batteries or the like. Compared to the NiCd batteries, the NiMH batteries or the like, the Li$^+$ batteries or the like are lighter in weight and have a larger capacity per unit volume. For this reason, the Li$^+$ batteries or the like are suited for use in apparatuses which must satisfy demands such as the realization of light weight and continuous use for a long period of time.

However, the Li$^+$ batteries or the like are easily damaged by an excessive discharge. For example, if the user erroneously subjects the Li$^+$ batteries to an excessive discharge, the Li$^+$ batteries suffer an irrecoverable damage. For this reason, a battery unit which includes a Li$^+$ battery or the like has a built-in excessive discharge preventing circuit which detects cuts off the battery output when the battery voltage becomes less than a predetermined voltage, in order to prevent deterioration of the battery function due to an erroneous operation of the user.

On the other hand, in the apparatus which uses the battery unit having the built-in excessive discharge preventing circuit, it is necessary to monitor the output voltage of the battery unit and to take measures so that data destruction or the like will not occur within the apparatus before the excessive discharge preventing circuit operates. Particularly in the case of the notebook type personal computer or the like, all of data being processed will be lost if the battery dies, and thus, the data must be saved in a non-volatile recording medium such as a floppy disk in good time by recognizing the remaining capacity of the battery. Accordingly, in order to prevent such data destruction or the like, some notebook type personal computers or the like are provided with a function of indicating the remaining capacity of the battery.

FIG. 1 is a circuit diagram for explaining a conventional battery capacity predicting method. In FIG. 1, a battery unit 501 is connected to an apparatus 502 such as a notebook type personal computer. The battery unit 501 has a built-in excessive discharge preventing circuit including a circuit portion 510 and a switch 515. The circuit portion 510 includes voltage comparators 511 through 513, and an OR circuit 514. In this example, three battery cells E1 through E3 are connected in series within the battery unit 501. An output voltage of the battery cell Ei and a reference voltage e1 which indicates an excessive discharge limit voltage of the battery cell Ei are supplied to the voltage comparator 51i, where i=1, 2 and 3. The switch 515 is made up of a field effect transistor (FET).

The battery cells E1 through E3 are made of Li$^+$ batteries, for example. The battery capacity predicting method can roughly be categorized into a method which predicts the battery capacity by subtracting the used power from the capacity of the battery, and a method which predicts the battery capacity from the output voltage of the battery. The Li$^+$ battery has a characteristic such that the output voltage of the Li$^+$ battery is a maximum value when fully charged and the output voltage decreases as the discharge progresses. For this reason, in this example, the latter method will be used to predict the remaining capacity of the battery.

The voltage comparators 511 through 513 output high-level signals when the output voltages of the corresponding battery cells E1 through E3 become less than or equal to the reference voltage e1. Hence, when one of the voltage comparators 511 through 513 outputs a high-level signal, the switch 515 is turned OFF in response to a high-level signal from the OR circuit 514, so as to disconnect the battery unit 501 from the apparatus 502. As a result, when the output voltage of at least one battery cell becomes less than or equal to the excessive discharge limit voltage, the output of the battery unit 501 is cut off and the excessive discharge of the battery cells E1 through E3 is prevented.

The apparatus 502 is provided with a voltage dividing circuit made up of resistors R1 and R2, a voltage measuring circuit 520 and the like. The voltage measuring circuit 520 measures the output voltage of the battery unit 501 which is obtained via the voltage dividing circuit, and predicts the remaining capacity of the battery unit 501 by comparing the measured output voltage and a predetermined reference voltage. This predetermined reference voltage is set slightly larger than three times the reference voltage e1 of the battery unit 501, by taking into account the inconsistencies among the capacities of the individual battery cells E1 through E3. When the output voltage of the battery unit 501, that is, the sum total of the output voltages of the battery cells E1 through E3, becomes less than or equal to the predetermined reference voltage, the apparatus 502 judges that the output voltage of the battery unit 501 has become close to the excessive discharge voltage and outputs an alarm to the user, for example.

The deterioration of the battery unit 501 due to the excessive discharge occurs when the output voltages of the individual battery cells E1 through E3 become less than or equal to the reference voltage e1. When the output voltages of the battery cells E1 through E3 which are connected in series within the battery unit 501 are balanced, it is unnecessary to monitor the output voltages of the individual battery cells E1 through E3. In this case, it is sufficient to monitor the sum total of the output voltages of the battery cells E1 through E3, and the excessive discharge preventing circuit may be operated when this sum total becomes less than or equal to a reference voltage.

However, in actual practice, the capacities of the individual battery cells E1 through E3 are inconsistent, and it is not unusual that the capacities of the battery cells E1 through E3 differ by approximately 10%. In addition, the differences among the capacities of the battery cells E1 through E3 become even larger as the number of charging and discharging cycles of the battery unit 501 increases, because the capacities of the battery cells E1 through E3 also become inconsistent depending on the individual deteriorations of the battery cells E1 through E3. For this reason, the built-in excessive discharge preventing circuit of the battery unit 501 monitors the output voltages of the individual battery cells E1 through E3, and the switch 515 is turned OFF when the output voltage of at least one of the battery cells E1 through E3 becomes less than or equal to the reference voltage e1, so as to cut off the output voltage of the battery unit 501 by disconnecting the battery unit 501 from the apparatus 502.

On the other hand, the apparatus 502 monitors the output voltage of the battery unit 501, that is, the sum total of the output voltages of the battery cells E1 through E3, predicts the remaining capacity of the battery unit 501 from this sum total, and detects the operation of the excessive discharge preventing circuit within the battery unit 501 before the excessive discharge preventing circuit turns OFF the switch 515. For this reason, it is necessary to set the predetermined reference voltage with a sufficient margin by taking into account the differences among the capacities of the individual battery cells E1 through E3.

But if the above described margin is too large, the apparatus 502 will judge that the end of the discharge of the battery unit 501 is near even though the actual remaining capacity of the battery unit 501 is sufficiently large. As a result, there is a problem in that the utilization efficiency of the battery unit 501 is poor. In addition, when the charging and discharging of the battery unit 501 are repeated in a state where the remaining capacity of the battery unit 501 is sufficiently large, there is a problem in that the serviceable life of the battery unit 501 is shortened by excessive charging.

On the other hand, if the above described margin is too small, the apparatus 502 continues to use the battery unit 501 even though the end of the discharge of the battery unit 501 is near. In this case, there is a problem in that the output voltage of the battery unit 501 is suddenly cut off by the excessive discharge preventing circuit during operation of the apparatus 502. When the output voltage of the battery unit 501 is suddenly cut off during operation of the apparatus 502, data destruction and the like occur within the apparatus 502, and the user may be faced with a fatal power failure.

SUMMARY OF THE INVENTION

Accordingly, it is a general object of the present invention to provide a novel and useful battery capacity predicting method, a battery unit and an apparatus using a battery unit, in which the problems described above are eliminated.

Another and more specific object of the present invention is to provide a battery capacity predicting method which can accurately predict a remaining capacity of a battery unit, so that the utilization efficiency of the battery unit is improved and the serviceable life of the battery unit is extended by preventing excessive charging even when the charging and discharging of the battery unit are repeated. The object of the present invention is also to provide a battery unit which enables such a battery capacity predicting method, and to an apparatus which uses such a battery unit.

Still another object of the present invention is to provide a battery capacity predicting method for predicting a remaining capacity of a battery unit including a plurality of battery cells connected in series in an apparatus which uses the battery unit, comprising the steps of (a) comparing output voltages of each of the battery cells, and (b) predicting the remaining capacity of the battery unit based on at least one of a minimum voltage and a maximum voltage out of the compared output voltages of the battery cells. According to the battery capacity predicting method of the present invention, it is possible to accurately predict the remaining capacity of the battery unit, and the utilization efficiency of the battery unit is improved.

A further object of the present invention is to provide a battery unit comprising a plurality of battery cells connected in series, and a circuit outputting at least one of a minimum voltage and a maximum voltage of output voltages of the battery cells. According to the battery unit of the present invention, it is possible to accurately predict the remaining capacity of the battery unit in the apparatus which uses the battery unit.

Another object of the present invention is to provide an apparatus for predicting a remaining capacity of a battery unit which has a plurality of battery cells connected in series, comprising coupling means for electrically coupling the battery unit to the apparatus, and predicting means for predicting the remaining capacity of the battery unit based on at least one of a minimum voltage and a maximum voltage of the battery cells. According to the apparatus of the present invention, it is posisble to accurately predict the remaining capacity of the battery unit, and thus, the utilization efficiency of the battery unit is improved.

Other objects and further features of the present invention will be apparent from the following detailed description when read in conjunction with the accompanying drawings.

DESCRIPTION OF THE PREFERRED EMBODIMENTS

Figure 1:
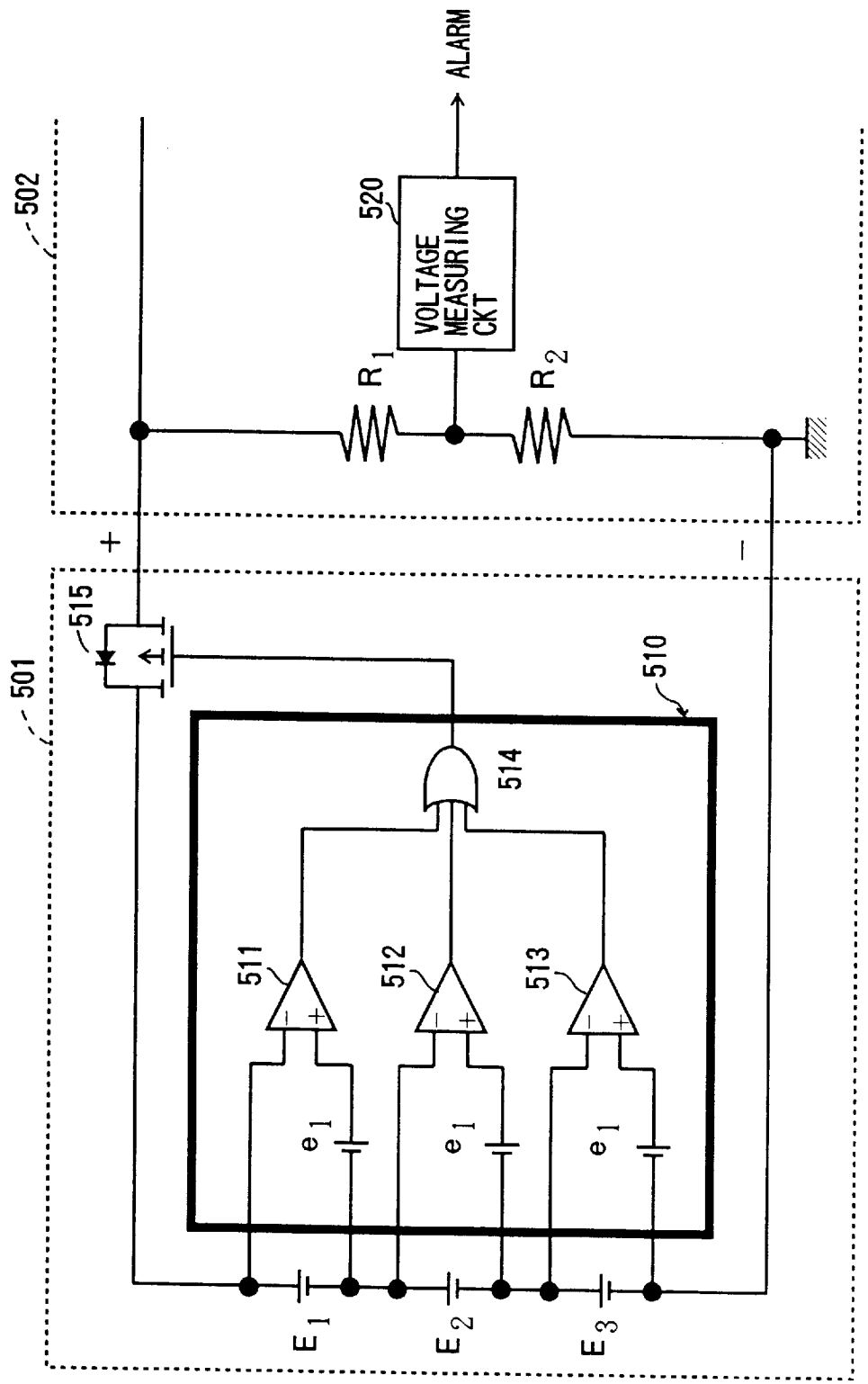
FIG. 1 is a circuit diagram for explaining a conventional battery capacity predicting method.

In order to eliminate the problems of the prior art described above, it is conceivable to monitor the output voltage of each battery cell within the apparatus, similarly to the monitoring made within the battery unit. However, in this case, it is necessary to provide terminals for supplying the output voltages of each of the battery cells to the apparatus. In addition, it is necessary to provide a circuit for comparing the output voltages of each of the battery cells with a reference voltage within the apparatus. As a result, the constructions of the battery unit and the apparatus become complex. In the example described above in conjunction with FIG. 1, the battery unit has three battery cells, but the number of terminals which become necessary to supply the output voltages of the battery cells to the apparatus increases as the number of battery cells forming the battery unit increases, and an extremely large number of terminals would be necessary to connect the battery unit and the apparatus when a large number of battery cells are provided within the battery unit. Therefore, this conceivable method is not practical.

Accordingly, in the present invention, the battery unit is constructed to output at least a minimum voltage, of the respective output voltages of the battery cells forming the battery unit. Further, the apparatus according to the present invention, which uses the battery unit, predicts the remaining capacity of the battery unit based on the minimum voltage which is obtained from the battery unit.

For this reason, the present invention can accurately predict a remaining capacity of the battery unit, so that the utilization efficiency of the battery unit is improved and the serviceable life of the battery unit is extended by preventing excessive charging even when the charging and discharging of the battery unit are repeated.

In addition, if the battery unit is constructed to also output a maximum voltage, of the respective output voltages of the battery cells forming the battery unit, the apparatus which uses the battery unit can judge whether or not to charge the battery unit based on that maximum voltage obtained from the battery unit.

In this case, it is possible to positively prevent excessive charging of the battery unit, and the serviceable life of the battery unit can be extended.

Furthermore, the battery unit may be constructed to output both a minimum voltage and a maximum voltage, of the respective output voltages of the battery cells forming the battery unit. In this case, it is possible to predict the remaining capacity of the battery unit based on at least one of those minimum and maximum voltages.

Figure 2:
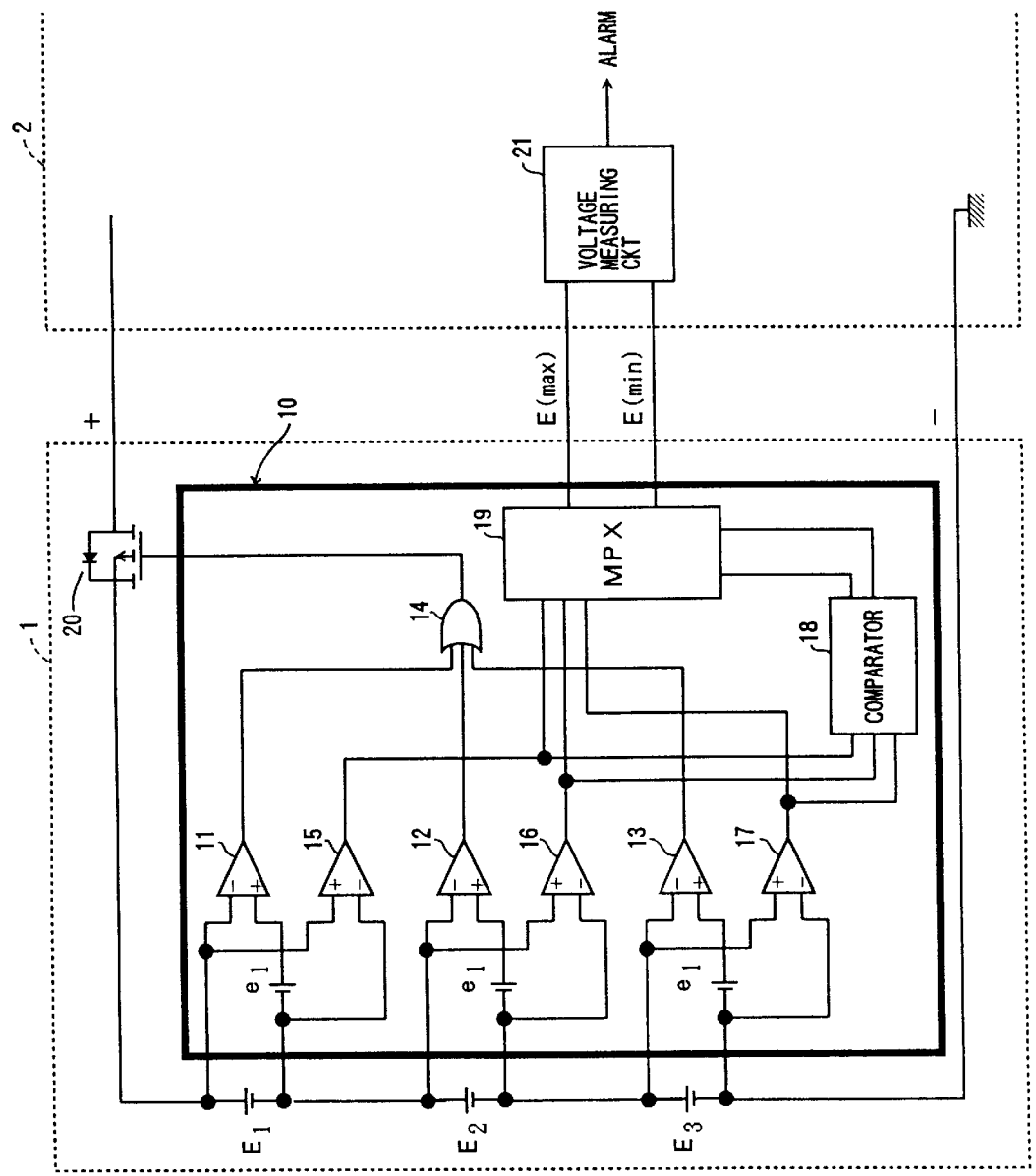
FIG. 2 is a circuit diagram showing a first embodiment of a battery unit according to the present invention and a portion of a first embodiment of an apparatus according to the present invention.

A description will now be given of a first embodiment of the battery capacity predicting method according to the present invention. FIG. 2 shows a first embodiment of the battery unit according to the present invention and a portion of a first embodiment of the apparatus according to the present invention which uses the battery unit. This apparatus employs the first embodiment of the battery capacity predicting method according to the present invention.

In FIG. 2, a battery unit 1 is connected to an apparatus 2 such as a notebook type personal computer. For the sake of convenience, FIG. 2 illustrates the battery unit 1 and the apparatus 2 as being connected by signal lines. However, the battery unit 1 and the apparatus 2 are actually connected via a plurality of terminals provided on the battery unit and a plurality of corresponding terminals provided on the apparatus 2 using a known technique. Hence, a sum, or total, voltage E1+E2+E3 from the battery unit 1, and a voltage E(min) and/or a voltage E(max), which will be described later are supplied to the apparatus 2.

The battery unit 1 has a built-in excessive discharge preventing circuit which includes a circuit portion 10 and a switch 20. The circuit portion 10 includes voltage comparators 11 through 13, an OR circuit 14, voltage converting amplifiers 15 through 17, a voltage comparator 18, and a multiplexer 19. In this embodiment, three battery cells E1 through E3 are connected in series within the battery unit 1. An output voltage the battery cell E1 and a reference voltage e1 which indicates an excessive discharge limit voltage, of each of the battery cells E1 through E3 are supplied to the voltage comparator 11. An output voltage of the battery cell E2 and the reference voltage e1 are supplied to the voltage comparator 12. Similarly, an output voltage of the battery cell E3 and the reference voltage e1 are supplied to the voltage comparator 13. The switch 20 is made up of a field effect transistor (FET).

The battery cells E1 through E3 are $Li^+$ batteries, for example. The battery capacity predicting method can roughly be categorized into a method which predicts the battery capacity by subtracting the used power from the capacity of the battery, and a method which predicts the battery capacity from the output voltage of the battery. The $Li^+$ battery has a characteristic such that the output voltage of the $Li^+$ battery is a maximum value when fully charged and the output voltage decreases as the discharge progresses. For this reason, in this embodiment, the latter method will be used to predict the remaining capacity of the battery.

The voltage comparators 11 through 13 output high-level signals when the output voltages of the corresponding battery cells E1 through E3 become less than or equal to the reference voltage e1. Hence, when one of the voltage comparators 11 through 13 outputs a high-level signal, the switch 20 is turned OFF in response to a high-level signal from the OR circuit 14, so as to disconnect the battery unit 1 from the apparatus 2. As a result, when the output voltage of at least one battery cell becomes less than or equal to the excessive discharge limit voltage, the output of the battery unit 1 is cut off and the excessive discharge of the battery cells E1 through E3 is prevented.

The voltage converting amplifiers 15 through 17 supply the output voltages of the corresponding battery cells E1 through E3 to the voltage comparator 18 and the multiplexer 19. The voltage comparator 18 compares the output voltages of the voltage converting amplifiers 15 through 17, and the multiplexer 19 selectively outputs at least a minimum voltage E(min) depending on a comparison result of the voltage comparator 18. In this embodiment, the voltage comparator 18 compares the output voltages of the voltage converting amplifiers 15 through 17, and the multiplexer 19 selectively outputs also a maximum voltage E(max) depending on the comparison result of the voltage comparator 18. As will be described later, the maximum voltage E(max) is used to prevent excessive charging of the battery unit 1.

The apparatus 2 is provided with a voltage measuring circuit 21 and the like. The voltage measuring circuit 21 measures the output voltage of the battery unit 1 which is obtained from the multiplexer 19, and predicts the remaining capacity of the battery unit 1 by comparing the measured output voltage and a predetermined reference voltage. More particularly, the minimum voltage E(min) from the battery unit 1 is compared with the predetermined reference voltage, and the voltage measuring circuit 21 judges that the output voltage of at least one of the battery cells E1 through E3 within the battery unit 1 has become close to the excessive discharge voltage when the minimum voltage E(min) becomes less than or equal to the predetermined reference voltage. For example, the voltage measuring circuit 21 outputs an alarm to the user when it is judged that the output voltage of at least one of the battery cells E1 through E3 has become close to the excessive discharge voltage. In this case, the predetermined reference voltage need not be set to include a margin by taking into account the inconsistencies among the capacities of the individual battery cells E1 through E3.

The deterioration of the battery unit 1 due to the excessive discharge occurs when the respective output voltages of the individual battery cells E1 through E3 become less than or equal to the reference voltage e1. When the respective output voltages of the battery cells E1 through E3 which are connected in series within the battery unit 1 are balanced, it is unnecessary to monitor the respective output voltages of the individual battery cells E1 through E3. In this case, it is sufficient to monitor the sum total of the respective output voltages of the battery cells E1 through E3, and the excessive discharge preventing circuit may be operated when this sum total becomes less than or equal to a reference voltage.

However, in actual practice, the capacities of the individual battery cells E1 through E3 are inconsistent, and it is not unusual that the capacities of the battery cells E1 through E3 differ by approximately 10%. In addition, the differences among the capacities of the battery cells E1 through E3 become even larger as the number of charging and discharging cycles of the battery unit 1 increases, because the capacities of the battery cells E1 through E3 also become inconsistent depending on the individual deteriorations of the battery cells E1 through E3. For this reason, the built-in excessive discharge preventing circuit of the battery unit 1 monitors the output voltages of the individual battery cells E1 through E3, and the switch 20 is turned OFF when the output voltage of at least one of the battery cells E1 through E3 becomes less than or equal to the reference voltage e1, so as to cut off the output voltage of the battery unit 1 by disconnecting the battery unit 1 from the apparatus 2.

On the other hand, the apparatus 2 monitors the output voltage of one of the battery cells E1 through E3 within the battery unit 1 having the minimum voltage E(min), predicts the remaining capacity of the battery unit 1 from this minimum voltage E(min), and detects the operation of the excessive discharge preventing circuit within the battery unit 1 before the excessive discharge preventing circuit turns OFF the switch 20. In this embodiment, it is unnecessary to set the predetermined reference voltage with a sufficient margin by taking into account the differences among the capacities of the individual battery cells E1 through E3. For this reason, this embodiment can accurately predict the remaining capacity of the battery unit 1, and the utilization efficiency of the battery unit 1 is improved.

Therefore, according to this embodiment, it is possible to prevent a situation in which the apparatus 2 erroneously judges the approaching end of the discharge of the battery unit 1 even though the actual remaining capacity of the battery unit 1 is sufficiently large, and thus, the utilization efficiency of the battery unit 1 is improved. In addition, although the serviceable life of the battery unit 1 would be shortened by the excessive charging if the charging and discharging of the battery unit 1 were repeated in a state where the remaining capacity is sufficiently large, such a problem will not occur in this embodiment.

Furthermore, this embodiment can prevent a situation in which the apparatus 2 continues to use the battery unit 1 even though the end of the discharge of the battery unit 1 is actually near. For this reason, this embodiment can prevent the output voltage of the battery unit 1 from being suddenly cut off by the excessive discharge preventing circuit during operation of the apparatus 2. In other words, if the output voltage of the battery unit 1 were suddenly cut off during operation of the apparatus 2, data destruction or the like would occur within the apparatus 2 and the user would face a fatal power failure. However, such a problem will not occur in this embodiment.

In apparatuses such as portable electronic equipments typified by the notebook type personal computers or lap-top computers, batteries are used as the power supply of the apparatus. By taking into consideration the running cost of the apparatus, the current capacity that can be discharged instantaneously and the like, and NiCd batteries, NiMH batteries and $Li^+$ batteries are generally used as secondary batteries. In addition, the apparatus is usually provided with a built-in charging circuit so that the secondary batteries can be charged by simply connecting an A.C. adapter or the like to the apparatus. In the case of the portable apparatus, the secondary batteries are normally used as the power supply of the apparatus, but when the apparatus is used on a desk, the apparatus may be powered by an external power supply using the A.C. adapter or the like.

When powering such an apparatus, which normally uses the secondary batteries, by the external power supply using the A.C. adapter or the like, the power supply from the secondary batteries is not used. Hence, in theory, the secondary batteries will not be drained while the apparatus is powered by the external power supply. However, in actual practice, the power of the secondary batteries is drained by the self-discharge of the secondary batteries. For this reason, even while the apparatus is powered by the external power supply using the A.C. adapter or the like, it is necessary to constantly charge the secondary batteries in order to make up for the power drain caused by the self-discharge of the secondary batteries. When the secondary battery is the NiCd battery or the NiMH battery, it is possible to prevent power drain of the secondary battery due to the self-discharge by constantly charging the secondary battery at a low charging rate while the apparatus is powered by the external power supply using the A.C. adapter or the like. This kind of charging is often referred to as trickle charging.

However, in a case where the secondary battery is the $Li^+$ battery, the trickle charging described above cannot be employed because the $Li^+$ battery will deteriorate due to the excessive charging. Hence, in the case of the $Li^+$ battery, it is necessary to monitor the output voltage of the $Li^+$ battery and to predict the remaining capacity of the $Li^+$ battery even while the apparatus is powered by the external power supply using the A.C. adapter or the like. In addition, when the monitored output voltage of the $Li^+$ battery becomes less than or equal to a reference voltage, the power drain of the $Li^+$ battery due to the self-discharge is made up for by starting the charging of the $Li^+$ battery, so as to realize the trickle charging by maintaining the $Li^+$ battery in a state close to the fully charged state.

The deterioration of the battery unit which includes the $Li^+$ battery cells due to the excessive charging occurs when the output voltages of the individual battery cells become greater than the reference voltage. For this reason, when the output voltages of the battery cells which are connected in series within the battery unit are balanced, it is unnecessary to monitor the output voltages of the individual battery cells. In this case, it is sufficient to monitor the sum total of the output voltages of the battery cells, and a built-in excessive charge preventing circuit of the battery unit may be operated when this sum total becomes greater than the reference voltage.

However, in actual practice, the respective capacities of the individual battery cells are inconsistent, and it is not unusual that the capacities of the battery cells differ by approximately 10%. In addition, the differences among the respective capacities of the battery cells become even larger as the number of charging and discharging cycles of the battery unit increases, because the capacities of the battery cells also become inconsistent depending on the individual deteriorations of the battery cells. For this reason, the built-in excessive charge preventing circuit of the battery unit monitors the respective output voltages of the individual battery cells, and the output voltage of the battery unit is cut off by disconnecting the battery unit from the apparatus when the output voltage of at least one of the battery cells becomes greater than the reference voltage.

On the other hand, the conventional apparatus described above in conjunction with FIG. 1 monitors the output voltage of the battery unit, that is, the sum total of the output voltages of the battery cells, and predicts the remaining capacity of the battery unit by comparing this sum total and a predetermined reference voltage. Hence, when detecting the operation of the excessive charge preventing circuit within the battery unit before the excessive charge preventing circuit actually operates, this detection is also based on the above prediction. For this reason, it is necessary to set the predetermined reference voltage on the lower side with a sufficient margin by taking into account the differences among the capacities of the individual battery.

But if the above described margin is too large, the apparatus will judge that the end of the charging of the battery unit is near even though the actual remaining capacity of the battery unit is sufficiently small and the charging is insufficient. As a result, the utilization efficiency of the battery unit is poor.

On the other hand, if the above described margin is too small, the apparatus continues to charge the battery unit even though the end of the charging of the battery unit is near and the charging is sufficient. In this case, the battery unit deteriorates because the battery unit is maintained to an excessively charged state.

Next, a description will be given of a second embodiment of the battery capacity predicting method according to the present invention which can also eliminate the above described inconveniences related to the charging of the battery unit.

Figure 3:
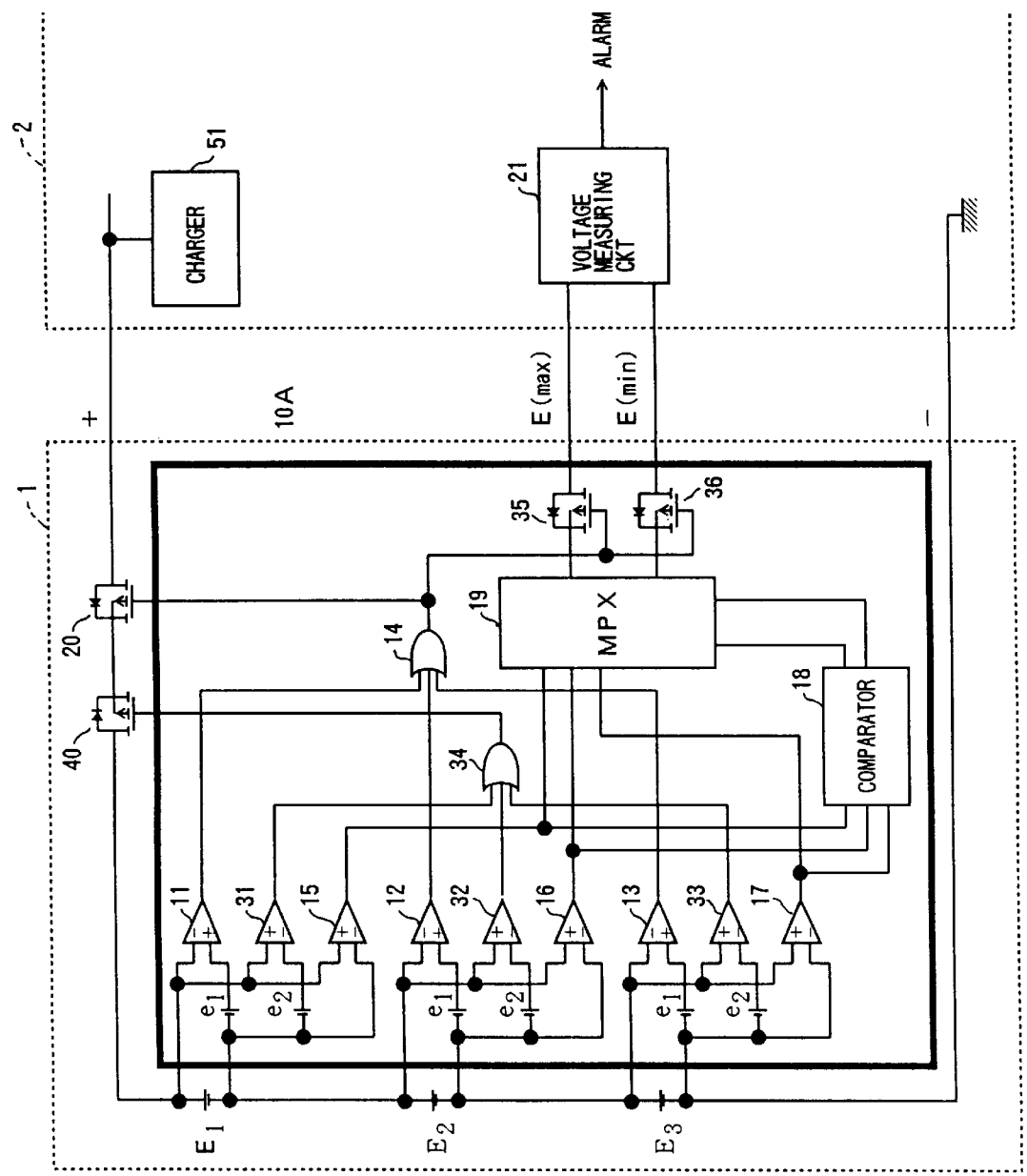
FIG. 3 is a circuit diagram showing a second embodiment of the battery unit according to the present invention and a portion of a second embodiment of the apparatus according to the present invention.

FIG. 3 shows a second embodiment of the battery unit according to the present invention and a portion of a second embodiment of the apparatus according to the present invention which uses the battery unit. This apparatus employs the second embodiment of the battery capacity predicting method according to the present invention. In FIG. 3, those parts which are the same as those corresponding parts in FIG. 2 are designated by the same reference numerals, and a description thereof will be omitted.

In FIG. 3, the battery unit 1 is further provided with a switch 40. In addition, a circuit portion 10A is further provided with voltage comparators 31 through 33, an OR circuit 34, and switches 35 and 36 which are made up of FETs. The apparatus 2 is further provided with a charger 51. The excessive discharge preventing circuit is formed by a part of the circuit portion 10A and the switch 20. On the other hand, an excessive charge preventing circuit is formed by a part of the circuit portion 10A and the switch 40.

The voltage comparators 31 through 33 output high-level signals when the output voltages of the corresponding battery cells E1 through E3 become greater than a reference voltage which is different from the reference voltage e1. Hence, when one of the voltage comparators 31 through 33 outputs a high-level signal, the switch 40 is turned OFF in response to a high-level signal from the OR circuit 34, so as to disconnect the battery unit 1 from the apparatus 2. As a result, when the output voltage of at least one battery cell becomes greater than the excessive charge limit voltage, the battery unit 1 is cut off from the charger 51 of the apparatus 2, and the excessive charging of the battery cells E1 through E3 is prevented.

The multiplexer 19 of the battery unit 1 supplies the minimum voltage E(min) out of the output voltages of the battery cells E1 through E3 to the voltage measuring circuit 21 of the apparatus 2 via the switch 35. Accordingly, the voltage measuring circuit 21 can accurately predict the remaining capacity of the battery unit 1 based on this minimum voltage E(min), and can output an alarm with respect to the user if necessary. In addition, the multiplexer 19 of the battery unit 1 supplies the maximum voltage E(max) out of the output voltages of the battery cells E1 through E3 to the voltage measuring circuit 21 of the apparatus 2 via the switch 36. Thus, the voltage measuring circuit 21 can accurately predict the remaining capacity of the battery unit 1, that is, the charged state of the battery unit 1, based on this maximum voltage E(max), and can judge whether or not to charge the battery unit 1. In addition, the voltage measuring circuit 21 can output an alarm if necessary to alarm the user of whether or not to charge the battery unit 1.

Therefore, this embodiment can accurately predict the remaining capacity of the battery unit 1, and prevent excessive discharge and excessive charging of the battery unit based on this prediction. As a result, the utilization efficiency of the battery unit 1 is improved, and the serviceable life of the battery unit 1 is effectively extended.

After the battery unit 1 is cut off from the apparatus 2, it is desirable to prevent discharge from the battery unit 1 as much as possible. Hence, in this embodiment, the switches 35 and 36 are turned OFF in response to the high-level signal from the OR circuit 14, so that the minimum voltage E(min) and the maximum voltage E(max) are respectively set to 0 V after the battery unit 1 is cut off from the apparatus 2. As a result, the power of the battery unit 1 will not be drained by the voltage measuring circuit 21 and the like of the apparatus 2 after the battery unit 1 is cut off from the apparatus 2, and the discharge of the battery unit 1 is suppressed to a minimum.

FIGS. 4 through 7 respectively are diagrams for explaining results of experiments conducted by the present inventors to study the inconsistencies in the capacities of the battery cells E1 through E3.

Figure 4:
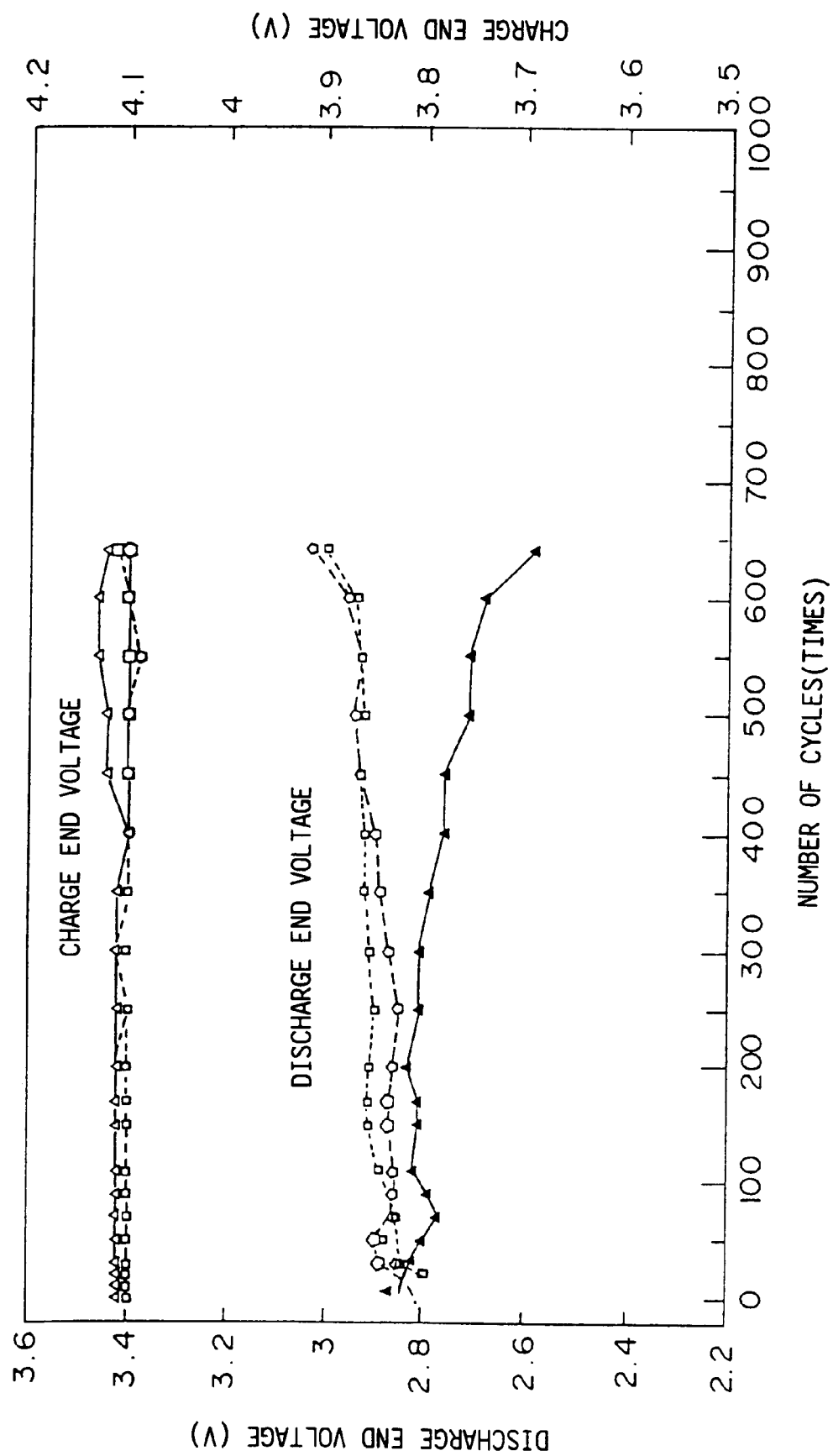
FIG. 4 is a diagram showing a relationship of a discharge end voltage and a charge end voltage with respect to a number of charging and discharging cycles for each battery cell.

FIG. 4 is a diagram showing a relationship of a discharge end voltage and a charge end voltage with respect to a number of charging and discharging cycles for each of the battery cells E1 through E3. In FIG. 4, the output voltage of the battery cell E1 is indicated by triangular marks, the output voltage of the battery cell E2 is indicated by square marks, and the output voltage of the battery cell E3 is indicated by pentagonal marks. The discharge end voltage was measured under the conditions 1 C (=2.5 A) and constant current (8.5 Vcut), and the charge end voltage was measured under conditions 1 C (=2.5 A) up to 12.3 V and constant current and constant voltage (40 mA or 2.5 hcut).

Figure 5:
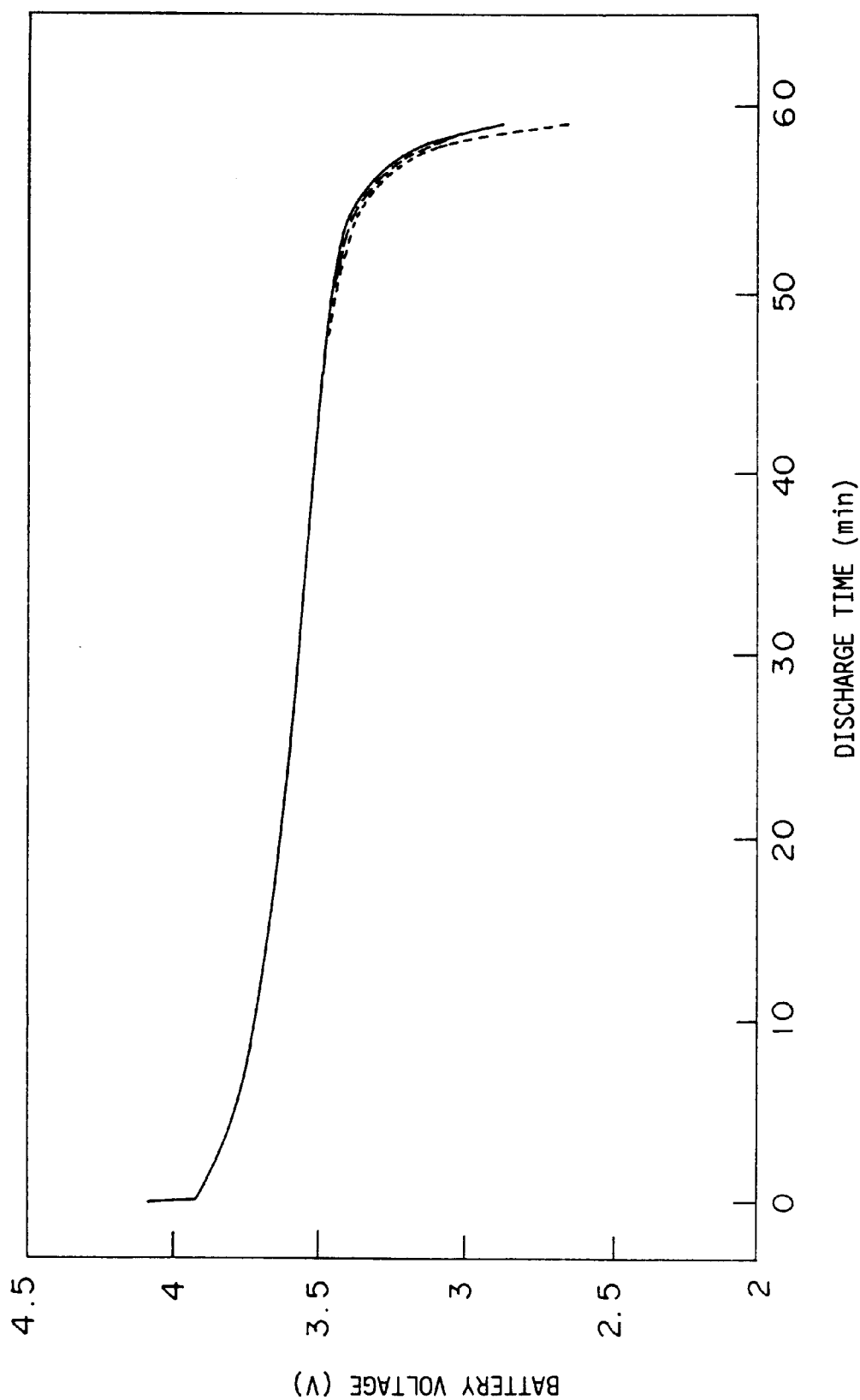
FIG. 5 is a diagram showing a relationship of a battery voltage and a discharge time of unused battery cells.

FIG. 5 is a diagram showing a relationship of a battery voltage and a discharge time of unused battery cells E1 through E3. In FIG. 5, the output voltage of the battery cell E1 is indicated by a fine broken line, the output voltage of the battery cell E2 is indicated by a solid line, and the output voltage of the battery cell E3 is indicated by a rough broken line. The discharge was measured under conditions 1 C (=2.5 A) and constant current (8.5 Vcut), and the charge was measured under conditions 1 C (=2.5 A) up to 12.3 V and constant current and constant voltage (40 mA or 2.5 hcut).

Figure 6:
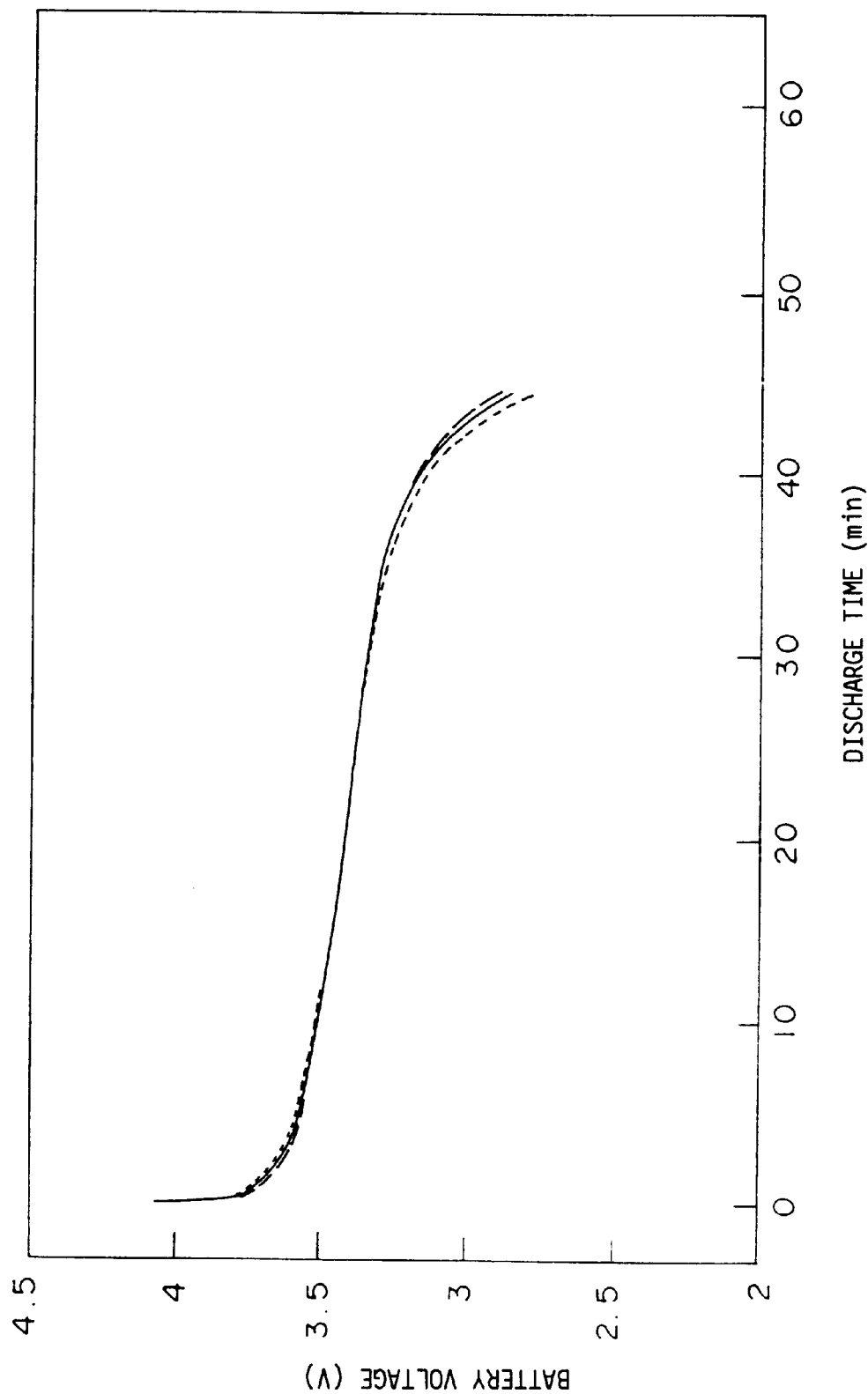
FIG. 6 is a diagram showing a relationship of the battery voltage and the discharge time of the battery cells which are subjected to 300 charging and discharging cycles.

FIG. 6 is a diagram showing a relationship of the battery voltage and the discharge time of the battery cells E1 through E3 which are subjected to 300 charging and discharging cycles. In FIG. 6, the output voltage of the battery cell E1 is indicated by a fine broken line, the output voltage of the battery cell E2 is indicated by a solid line, and the output voltage of the battery cell E3 is indicated by a rough broken line. The discharge was measured under conditions 1 C (=2.5 A) and constant current (8.5 Vcut), and the charge was measured under conditions 1 C (=2.5 A) up to 12.3 V and constant current and constant voltage (40 mA or 2.5 hcut).

Figure 7:
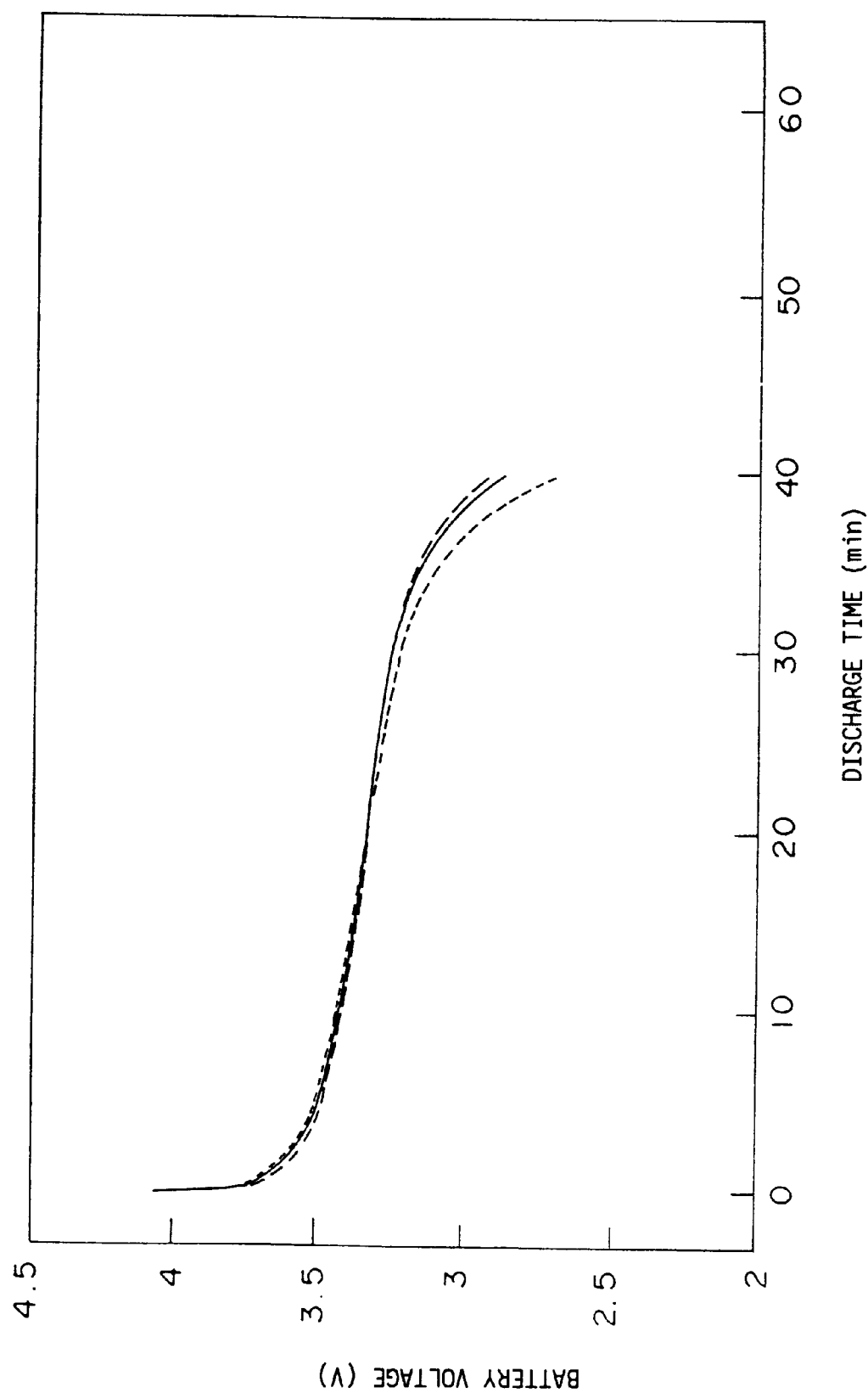
FIG. 7 is a diagram showing a relationship of the battery voltage and the discharge time of the battery cells which are subjected to five hundred (500) charging and discharging cycles.

FIG. 7 is a diagram showing a relationship of the battery voltage and the discharge time of the battery cells E1 through E3 which are subjected to five hundred (500) charging and discharging cycles. In FIG. 7, the output voltage of the battery cell E1 is indicated by a fine broken line, the output voltage of the battery cell E2 is indicated by a solid line, and the output voltage of the battery cell E3 is indicated by a rough broken line. The discharge was measured under conditions 1 C (=2.5 A) and constant current (8.5 Vcut), and the charge was measured under conditions 1 C (=2.5 A) up to 12.3 V and constant current and constant voltage (40 mA or 2.5 hcut).

As may be seen from FIGS. 4 through 7, the capacities of the individual battery cells E1 through E3 are inconsistent, and it was confirmed that it is perfectly normal for the capacities of the battery cells E1 through E3 to differ by a value on the order of 10%. In addition, it was also confirmed that the differences among the capacities of the individual battery cells E1 through E3 become even larger as the number of charging and discharging cycles of the battery unit 1 increases because of the inconsistencies in the capacities that are caused by the deterioration of the individual battery cells E1 through E3. However, according to this embodiment, it was confirmed that the apparatus 2 can accurately predict the remaining capacity of the battery unit 1 based on the minimum voltage E(min) and/or the maximum voltage E(max), even if such inconsistencies exist among the capacities of the individual battery cells E1 through E3. The same was also confirmed with respect to the first embodiment described above.

Figure 8:
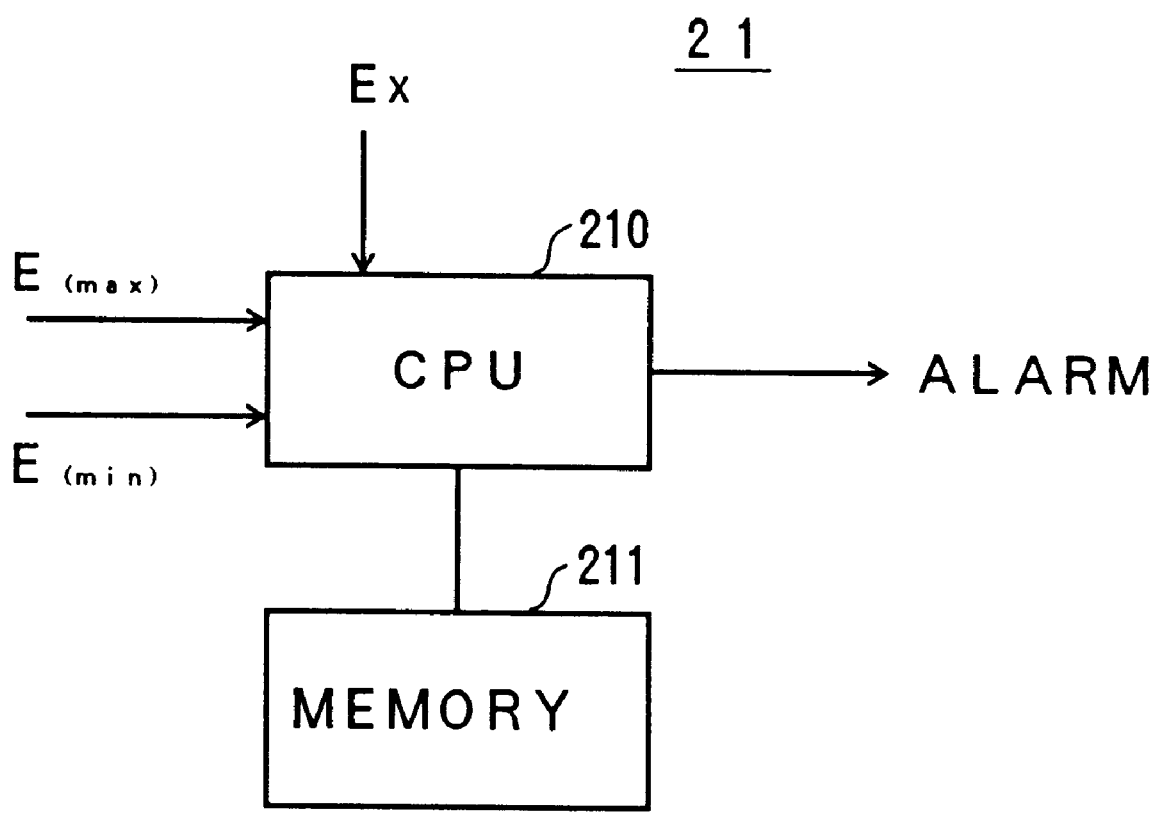
FIG. 8 is a system block diagram showing the construction of a voltage measuring circuit.

The voltage measuring circuit 21 within the apparatus 2 may be formed by a combination of a known central processing unit (CPU) and a memory, for example. FIG. 8 shows this construction of the voltage measuring circuit 21. In FIG. 8, the voltage measuring circuit 21 includes a CPU 210 and a memory 211 which are connected as shown. The memory 211 stores data and programs which are executed by the CPU 210. The CPU 210 receives the minimum voltage E(min) and the maximum voltage E(max) from the battery unit 1 shown in FIG. 3.

Figure 9:
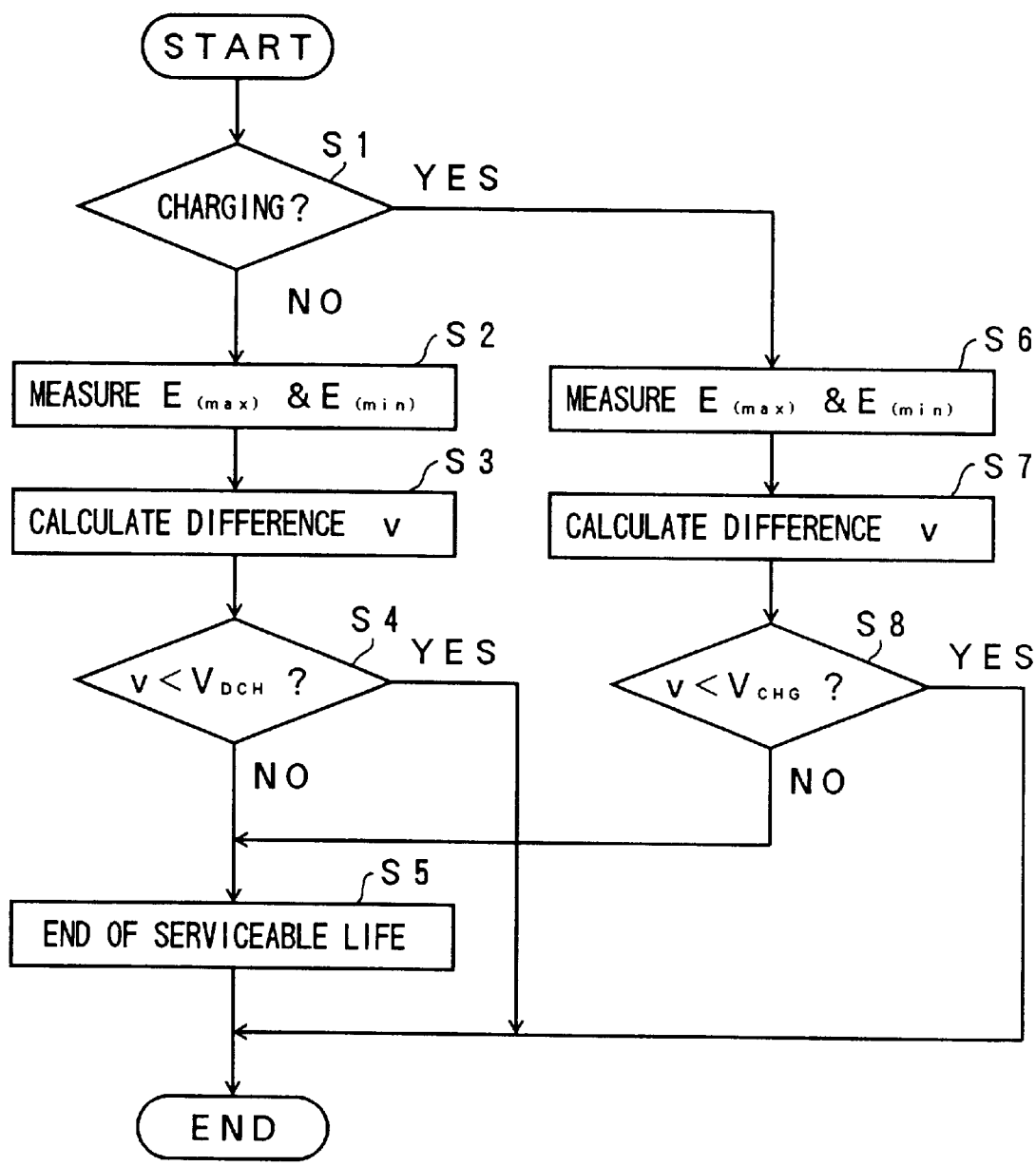
FIG. 9 is a flow chart for explaining an embodiment of the operation of a CPU.

FIG. 9 is a flow chart for explaining an embodiment of the operation of the CPU 210. In FIG. 9, a step S1 decides whether or not the apparatus 2 is charging the battery unit 1. When the apparatus 2 charges the battery unit 1, power from an external power supply (not shown) is supplied to the apparatus 2 via a known A.C. adapter (not shown) or the like. Accordingly, the CPU 210 can judge whether or not the apparatus 2 is charging the battery unit 1 based on a detection signal Ex which indicates that the A.C. adapter is connected to the apparatus 2.

If the decision result in the step S1 is NO, a step S2 measures the maximum voltage E(max) and the minimum voltage E(min), and a step S3 calculates a voltage difference v from v=E(max)−E(min). A step S4 decides whether or not the voltage difference v is smaller than an excessive discharge lower limit voltage $V_{DCH}$ of the discharging, and the process ends if the decision result in the step S4 is YES. On the other hand, if the decision result in the step S4 is NO, a step S5 judges that the serviceable life of the battery unit 1 has ended, and the process ends. When the step S5 judges that the serviceable life of the battery unit 1 has ended, the CPU 210 outputs an alarm with respect to the user, for example, by using a known technique.

If the decision result in the step S1 is YES, a step S6 measures the maximum voltage E(max) and the minimum voltage E(min), and a step S7 calculates a voltage difference v from v=E(max)−E(min). A step S8 decides whether or not this voltage difference v is smaller than an excessive charging upper limit voltage $V_{CHG}$ of the charging, and the process ends if the decision result in the step S8 is YES. On the other hand, if the decision result in the step S8 is NO, the step S5 judges that the serviceable life of the battery unit 1 has ended, and the process ends. When the step S5 judges that the serviceable life of the battery unit 1 has ended, the CPU 210 outputs an alarm with respect to the user, for example, by using a known technique.

Therefore, the apparatus 2 can accurately judge the serviceable life of the battery unit 1 during the discharge and the charging, based on the minimum voltage E(min) and the maximum voltage E(max) received from the battery unit 1.

Figure 10:
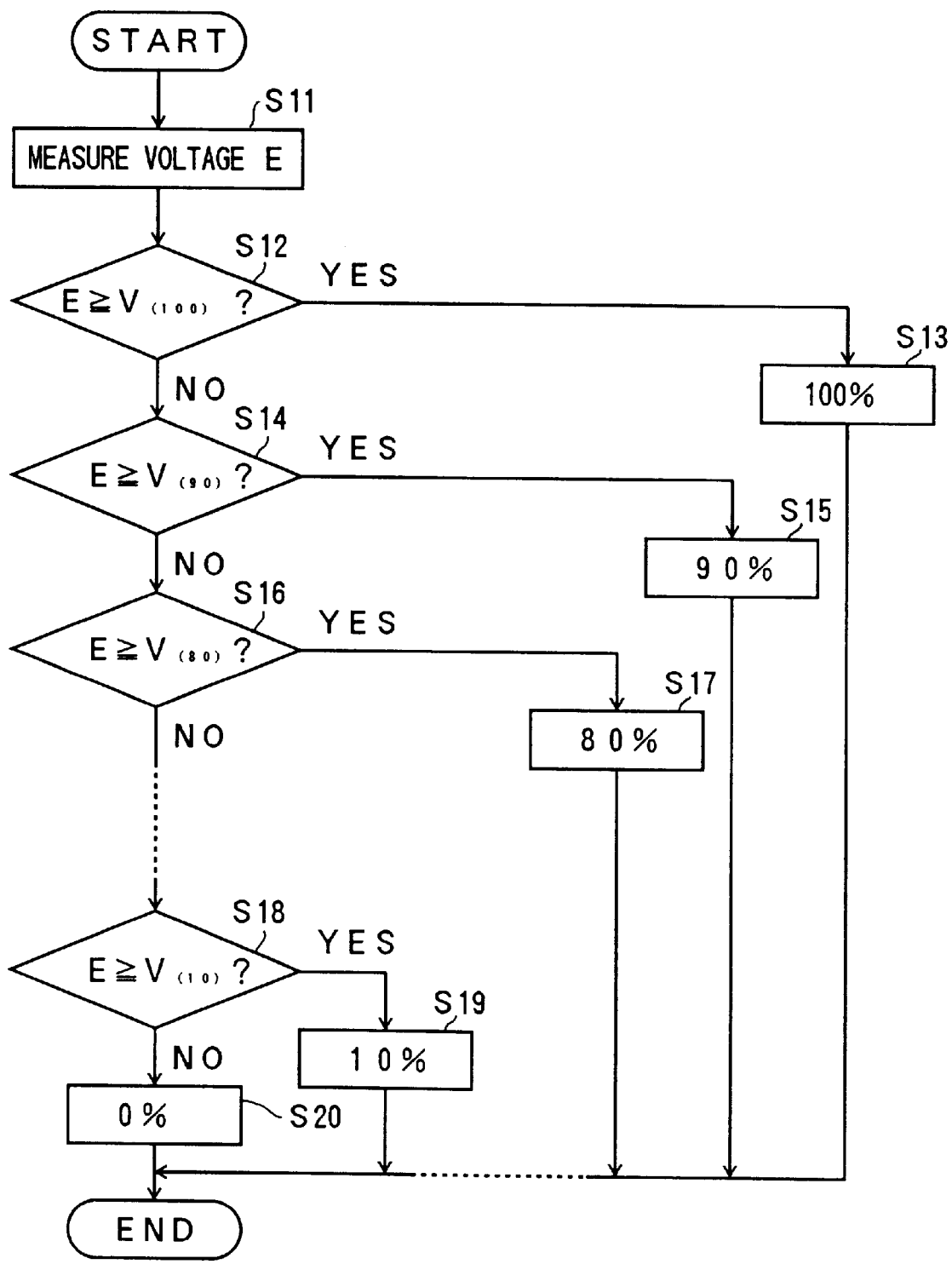
FIG. 10 is a flow chart for explaining another embodiment of the operation of the CPU.

FIG. 10 is a flow chart for explaining another embodiment of the operation of the CPU 210. In FIG. 10, a step S11 measures the minimum voltage E(min) received from the battery unit 1, and obtains an output voltage E of the battery unit 1 as a whole. In this embodiment, the battery unit 1 includes the three battery cells E1 through E3, and thus, the output voltage E is obtained from E=E(min)·3, for example. A step S12 decides whether or not the output voltage E is greater than or equal to a battery voltage V(100) at the time when the remaining capacity is 100%. If the decision result in the step S12 is YES, a step S13 judges that the remaining capacity of the battery unit 1 is 100%, and the process ends. If the decision result in the step S12 is NO, a step S14 decides whether or not the output voltage E is greater than or equal to a battery voltage V(90) at the time when the remaining capacity is 90%. If the decision result in the step S14 is YES, a step S15 judges that the remaining capacity of the battery unit 1 is 90%, and the process ends. If the decision result in the step S14 is NO, a step S16 decides whether or not the output voltage E is greater than or equal to a battery voltage V(80) at the time when the remaining capacity is 80%. If the decision result in the step S16 is YES, a step S17 judges that the remaining capacity of the battery unit 1 is 80%, and the process ends. Similar processes are carried out if the decision result in the step S16 is NO. Finally, a step S18 decides whether or not the output voltage E is greater than or equal to a battery voltage V(10) at the time when the remaining capacity is 10%. If the decision result in the step S18 is YES, a step S19 judges that the remaining capacity of the battery unit 1 is 10%, and the process ends. If the decision result in the step S18 is NO, a step S20 judges that the remaining capacity of the battery unit 1 is 0% and the process ends.

The decision results of the steps S13, S15, S17, S19, S20 and the like are output from the CPU 210 with respect to the user by using known techniques, for example. In addition, the decision results of the steps S19, S20 and the like may be output from the CPU 210 in the form of an alarm with respect to the user by using known techniques, for example.

In the embodiment described above, it was assumed for the sake of convenience that the battery unit includes $Li^+$ battery cells. However, the application of the present invention is of course not limited to the $Li^+$ battery cells, and the present invention is similarly applicable to the NiMH battery cells, for example.

Further, the present invention is not limited to these embodiments, but various variations and modifications may be made without departing from the scope of the present invention.

What is claimed is:

1. A battery capacity predicting method predicting a remaining capacity of a battery unit including a plurality of battery cells having respective voltages and connected in series in an apparatus which uses the battery unit, said battery capacity predicting method comprising the steps of:
   (a) comparing the respective voltages of the plurality of battery cells; and
   (b) predicting the remaining capacity of the battery unit based on at least one of a minimum voltage and a maximum voltage of the compared, respective voltages of the plurality of battery cells.

2. The battery capacity predicting method as claimed in claim 1, wherein said step (b) predicts the remaining capacity of the battery unit based on the minimum voltage during discharge of the battery unit.

3. The battery capacity predicting method as claimed in claim 1, wherein said step (b) predicts the remaining capacity of the battery unit based on the maximum voltage during charging of the battery unit.

4. The battery capacity predicting method as claimed in claim 2, wherein said step (b) predicts the remaining capacity of the battery unit based on the maximum voltage during charging of the battery unit.

5. The battery capacity predicting method as claimed in claim 1, wherein said step (b) predicts a serviceable life of the battery unit based on a difference between the maximum voltage and the minimum voltage.

6. A battery unit comprising:
   a plurality of battery cells having respective voltages and connected in series;
   an output circuit outputting at least one of a minimum voltage and a maximum voltage of the respective voltages of the battery cells;
   a first cut-off circuit cutting off an output, to an outside of the battery unit, of a sum total voltage of the respective voltages of the plurality of battery cells when at least one of the respective voltages of the plurality of battery cells becomes less than or equal to a first reference voltage; and
   a second cut-off circuit cutting off the output, from the output circuit and to the outside of the battery unit, of the at least one of the minimum voltage and the maximum voltage cutting off operation of said first cut-off circuit.

7. The battery unit as claimed in claim 6, which further comprises:
   a third cut-off circuit cutting off an output, to the outside of the battery unit, of a sum total voltage of the respective voltages of the battery cells when at least one of the respective voltages of the plurality of battery cells becomes greater than a second reference voltage which is different from the first reference voltage.

8. An apparatus predicting a remaining capacity of a battery unit which has a plurality of battery cells having respective voltages and connected in series, said apparatus comprising:
   a coupler electrically coupling the battery unit to said apparatus; and
   a predicting unit predicting the remaining capacity of the battery unit based on at least one of a minimum voltage and a maximum voltage of the respective voltages of the plurality of battery cells.

9. The apparatus as claimed in claim 8, wherein said predicting unit predicts the remaining capacity of the battery unit based on the minimum voltage during discharge of the battery unit.

10. The apparatus as claimed in claim 8, wherein said predicting unit predicts the remaining capacity of the battery unit based on the maximum voltage during charging of the battery unit.

11. The apparatus as claimed in claim 9, wherein said predicting unit predicts the remaining capacity of the battery unit based on the maximum voltage during charging of the battery unit.

12. The apparatus as claimed in claim 8, wherein said predicting unit predicts a serviceable life of the battery unit based on a difference between the maximum voltage and the minimum voltage.

13. The apparatus as claimed in claim 8, wherein said predicting unit, further, judges whether or not to charge the battery unit based on the predicted remaining capacity of the battery unit.

14. The battery capacity predicting method as claimed in claim 1, further comprising the step of:
   (c) outputting an alarm based on the predicted remaining capacity of the battery unit.

15. The battery capacity predicting method as claimed in claim 14, wherein the alarm is output based on the battery cell having the minimum respective voltage.

16. The apparatus as claimed in claim 8, further comprising:
   an alarm unit generating an alarm in response to the predicted remaining capacity of the battery unit.

17. The apparatus as claimed in claim 16, wherein the alarm unit responds to the voltage of the minimum voltage level, of the respective voltages of the plurality of battery cells.

18. A method of predicting a remaining capacity of a battery unit which comprises a plurality of battery cells having respective voltages and connected in series in an apparatus which uses the battery unit, said method comprising the steps of:
   (a) comparing the respective voltages of the plurality of battery cells; and
   (b) predicting the remaining capacity of the battery unit based on a minimum voltage of the compared, respective voltages of the plurality of battery cells.

19. The method as claimed in claim 18, wherein said step (b) predicts the remaining capacity of the battery unit based on the minimum voltage during a discharge of the battery unit.

20. A method of predicting a remaining capacity of a battery unit including a plurality of battery cells having respective voltages and connected in series in an apparatus which uses the battery unit, said method comprising the steps of:
   (a) comparing the respective voltages of the plurality of battery cells; and
   (b) predicting the remaining capacity of the battery unit based on a maximum voltage of the compared, respective voltages of the plurality of battery cells.

21. The method as claimed in claim 20, wherein said step (b) predicts the remaining capacity of the battery unit based on the maximum voltage during a discharge of the battery unit.

22. A battery unit comprising a plurality of battery cells having respective voltages and connected in series, comprising:

an excessive-discharging and/or excessive-charging preventing circuit preventing excessive-discharging and/or excessive-charging of each of the plurality of battery cells; and an output circuit outputting a minimum voltage and/or a maximum voltage of the respective voltages of the plurality of battery cells.

23. The battery unit as claimed in claim 22, wherein said excessive-discharging and/or excessive-charging preventing circuit includes a cut-off circuit cutting-off an output of a sum total voltage of the respective voltages of the plurality of battery cells to an outside of the battery unit when at least one of the respective voltages of the plurality of battery cells becomes less than or equal to a reference voltage.

24. The battery unit as claimed in claim 22, wherein said excessive-discharging and/or excessive-charging preventing circuit includes a cut-off circuit cutting-off an output of a sum total voltage of the respective voltages of the plurality of battery cells to an outside of the battery unit when at least one of the respective voltages of the plurality of battery cells becomes greater than or equal to a reference voltage.

25. The battery unit as claimed in claim 23, further comprising:

a minimum voltage and/or maximum voltage cut-off circuit cutting-off the output, by the output circuit, of the minimum voltage and/or the maximum voltage to the outside of the battery unit responsive to an operation of said excessive-discharging and/or excessive-charging preventing circuit.

26. The battery unit as claimed in claim 22, further comprising:

a discharging switch discharging the plurality of battery units to an outside of the battery unit; and said excessive-discharging and/or excessive-charging preventing circuit further including a switch opening circuit opening said discharging switch when at least one of the respective voltages of the plurality of battery cells becomes less than or equal to reference voltage.

27. The battery unit as claimed in claim 22, further comprising:

a charging switch charging the plurality of battery units; and said excessive-discharging and/or excessive-charging preventing circuit further including a switch opening circuit opening said charging switch when at least one of the voltages of the plurality of battery cells becomes greater than or equal to a reference voltage.

28. The battery unit as claimed in claim 26, further comprising:

a minimum voltage and/or maximum voltage cut-off circuit cutting-off the output of the minimum voltage and/or the maximum voltage to the outside of the battery unit responsive to an operation of said excessive-discharging and/or excessive-charging preventing circuit.

29. A battery unit comprising:

a plurality of battery cells connected in series and having respective output voltages;

an excessive-discharging preventing circuit preventing excessive-discharging of each of the plurality of battery cells; and an output circuit outputting a minimum voltage of the respective voltages of the plurality of battery cells.

30. The battery unit as claimed in claim 29, wherein said excessive-discharging preventing circuit includes a cut-off circuit cutting-off an output of a sum total voltage of the respective voltages of the plurality of battery cells to an outside of the battery unit when at least one of the respective voltages of the plurality of battery cells becomes less than or equal to a reference voltage.

31. The battery unit as claimed in claim 29, further comprising:

a minimum voltage and/or maximum voltage cut-off circuit cutting-off an output of the minimum voltage and/or the maximum voltage to the outside of the battery unit responsive to an operation of said excessive-discharging preventing circuit.

32. The battery unit as claimed in claim 29, further comprising:

a discharging switch discharging the plurality of battery cells to an outside of the battery unit; and said excessive-discharging preventing circuit further including a switch opening circuit opening said discharging switch when at least one of the respective voltages of the plurality of battery cells becomes less than or equal to a reference voltage.

33. The battery unit as claimed in claim 32, further comprising:

a minimum voltage and/or maximum voltage cut-off circuit cutting-off the output of the minimum voltage and/or the maximum voltage to the outside of the battery unit responsive to an operation of said excessive-discharging preventing circuit.

34. A battery unit comprising:

a plurality of battery cells connected in series and having respective voltages;

an excessive-charging preventing circuit preventing excessive-charging of each of the plurality of battery cells; and an output circuit outputting a maximum voltage of the respective voltages of the plurality of battery cells.

35. The battery unit as claimed in claim 34, wherein said excessive-charging preventing circuit includes a cut-off circuit cutting-off an output of a sum total voltage of the respective voltages of the plurality of battery cells to an outside of the battery unit when at least one of the respective voltages of the plurality of battery cells becomes greater than or equal to a reference voltage.

36. The battery unit as claimed in claim 34, further comprising:

a charging switch charging the plurality of battery cells, said excessive-charging preventing circuit including a switch opening circuit opening said charging switch when at least one of the voltages of the plurality of battery cells becomes greater than or equal to a reference voltage.

37. An apparatus predicting a remaining capacity of a battery unit which has a plurality of battery cells having respective voltages and connected in series, said apparatus comprising:

a coupler electrically coupling the battery unit to said apparatus;

a terminal receiving a minimum voltage of the respective voltages of the plurality of battery cells of the battery unit; and a detecting unit detecting over-discharging of the battery unit based on the minimum voltage.

38. The apparatus as claimed in claim 37, further comprising:

a predicting unit predicting a remaining capacity of the battery unit based on the minimum voltage during discharging of the battery unit.

39. An apparatus predicting a remaining capacity of a battery unit which has a plurality of battery cells having respective voltages and connected in series, said apparatus comprising:

a coupler electrically coupling the battery unit to said apparatus;

a terminal receiving a maximum voltage of the respective voltages of the battery cells of the battery unit; and a detecting unit detecting over-charging of the battery unit based on the maximum voltage.

40. The apparatus as claimed in claim 39, further comprising:

a predicting unit predicting a remaining capacity of the battery unit based on the maximum voltage during charging of the battery unit.

41. The apparatus as claimed in claim 38, wherein said predicting unit predicts the remaining capacity of the battery unit based on a maximum voltage of the respective voltages of the plurality of battery cells of the battery unit during charging of the battery unit.

42. An apparatus predicting a remaining capacity of a battery unit which has a plurality of battery cells connected in series, comprising:

an output circuit outputting a minimum voltage and/or a maximum voltage of respective voltages of the plurality of battery cells; and a predicting unit predicting the remaining capacity of the battery unit based on the minimum voltage and/or the maximum voltage.

43. The apparatus as claimed in claim 42, wherein said predicting unit predicts the remaining capacity of the battery unit based on the minimum voltage during discharging of the battery unit.

44. The apparatus as claimed in claim 42, wherein said predicting unit predicts the remaining capacity of the battery unit based on the maximum voltage during charging of the battery unit.

45. An apparatus for predicting a remaining capacity of a battery unit which has a plurality of battery cells connected in series and having respective output voltages, comprising:

an output circuit outputting a minimum voltage of the respective voltages of the plurality of battery cells; and a predicting unit predicting the remaining capacity of the battery unit based on the minimum voltage.

46. The apparatus as claimed in claim 45, wherein said predicting unit predicts the remaining capacity of the battery unit based on the minimum voltage during discharging of the battery unit.

47. An apparatus predicting a remaining capacity of a battery unit which has a plurality of battery cells connected in series and having respective output voltages, comprising:

an output circuit outputting a maximum voltage of the respective voltages of the plurality of battery cells; and a predicting unit predicting the remaining capacity of the battery unit based on the maximum voltage.

48. The apparatus as claimed in claim 47, wherein said predicting unit predicts the remaining capacity of the battery unit based on the maximum voltage during charging of the battery unit.

49. A method judging a serviceable life of a battery unit including a plurality of battery cells having respective voltages and connected in series in an apparatus which uses the battery unit, said method comprising the steps of:

(a) comparing the respective voltages of the plurality of battery cells; and (b) judging the serviceable life of the battery unit based on a maximum battery cell voltage value and a minimum battery cell voltage value of the respective voltages of the plurality of battery cells.

50. The method as claimed in claim 49, wherein said step (b) judges the serviceable life of the battery unit based on a difference between the maximum battery cell voltage value and the minimum battery cell voltage value.

51. An apparatus judging a serviceable life of a battery unit which has a plurality of battery cells connected in series and having respective output voltages, said apparatus comprising:

a coupling unit electrically coupling the battery unit to said apparatus; and a judging unit judging the serviceable life of the battery unit based on a maximum voltage and a minimum voltage of the respective voltages of the plurality of battery cells.

52. An apparatus judging a serviceable life of a battery unit which has a plurality of battery cells connected in series and having respective output voltages, said apparatus comprising:

a judging unit judging the serviceable life of the battery unit based on a maximum voltage and a minimum voltage of the respective voltages of the plurality of battery cells.

53. An apparatus judging a serviceable life of a battery unit which has a plurality of battery cells connected in series and having respective output voltages, comprising:

a comparing unit comparing voltages of each of the plurality of battery cells so as to derive a minimum battery cell voltage value and a maximum battery cell voltage value of the respective voltages of the plurality of battery cells; and a judging unit judging the serviceable life of the battery unit based on the maximum cell voltage value and the minimum battery cell voltage value.

54. The apparatus as claimed in claim 47, wherein said judging unit judges the serviceable life of the battery unit based on a difference between the maximum battery cell voltage value and the minimum battery cell voltage value.

55. The apparatus as claimed in claim 48, wherein said judging unit judges the serviceable life of the battery unit based on a difference between the maximum battery cell voltage value and the minimum battery cell voltage value.

56. The apparatus as claimed in claim 49, wherein said judging unit judges the serviceable life of the battery unit based on a difference between the maximum battery cell voltage value and the minimum battery cell voltage value.

57. The battery unit as claimed in claim 37, further comprising:

a minimum voltage and/or maximum voltage cut-off circuit cutting-off an output of the minimum voltage and/or the maximum voltage to the outside of the battery unit when at least one of the respective voltages of the plurality of battery cells becomes less than or equal to a reference voltage.

58. An apparatus predicting a remaining capacity of a battery unit which has a plurality of battery cells having respective voltages and connected in series, said apparatus comprising:

a predicting unit predicting the remaining capacity of the battery unit based on a minimum voltage of the respective voltages of the battery cells of the battery unit.

59. The apparatus as claimed in claim 58, further comprising:

a coupler electrically coupling the better unit to said apparatus.

60. The apparatus as claimed in claim 58, wherein said predicting unit predicts the remaining capacity of the battery unit based on the minimum voltage during discharge of the battery unit.

61. The apparatus as claimed in claim 58, further comprising:

a terminal receiving the minimum voltage of the respective voltages of the battery cells of the battery unit.

62. An apparatus predicting a remaining capacity of a battery unit which has a plurality of battery cells having respective voltages and connected in series, said apparatus comprising:

a predicting unit predicting the remaining capacity of the battery unit based on a maximum voltage of the respective voltages of the battery cells of the battery unit.

63. The apparatus as claimed in claim 58, further comprising:

a coupler electrically coupling the battery unit to said apparatus.

64. The apparatus as claimed in claim 62, wherein said predicting unit predicts the remaining capacity of the battery unit based on the maximum voltage during charging of the battery unit.

65. The apparatus as claimed in claim 62, further comprising:

a terminal receiving the maximum voltage of the respective voltages of the plurality of battery cells of the battery unit.

66. An apparatus connectable to a battery unit of plural battery cells having respective voltages and connected in series, comprising:

a predicting unit predicting the remaining capacity of the battery unit based on a selected one of maximum and minimum voltages of the respective voltages of the plurality of battery cells.

67. The apparatus as claimed in claim 66, further comprising:

a coupler electrically coupling the battery unit to said apparatus.

68. The apparatus as claimed in claim 66, wherein said predicting unit predicts the remaining capacity of the battery unit based on the selected one of the maximum and minimum voltages during charging of the battery unit.

69. The apparatus as claimed in claim 66, further comprising:

a terminal receiving the selected one of the maximum and minimum voltages of the respective voltages of the plurality of battery cells of the battery unit.

70. An apparatus connectable to a battery unit of a plurality of battery cells having respective voltages and connected in series, comprising:

a predicting unit predicting a remaining capacity of the battery unit based on maximum voltage of the respective voltages of the plural battery cells.

71. The apparatus as claimed in claim 70, further comprising:

a coupler electrically coupling the apparatus to the battery unit.

72. The apparatus as claimed in claim 70, wherein said predicting unit predicts the remaining capacity of the battery unit based on the maximum voltage during charging of the battery unit.

73. An apparatus connectable to a battery unit of a plurality of battery cells having respective output voltages and connected in series, comprising:

a predicting unit predicting a remaining capacity of the battery unit based on a minimum voltage of the respective voltages of the plurality of battery cells.

74. The apparatus as claimed in claim 73, further comprising:

a coupler electrically coupling the apparatus to the battery unit.

75. The apparatus as claimed in claim 73, wherein said predicting unit predicts the remaining capacity of the battery unit based on the minimum voltage during discharging of the battery unit.

* * * * *